(12) United States Patent
Fukuda

(10) Patent No.: US 7,199,000 B2
(45) Date of Patent: Apr. 3, 2007

(54) METHOD FOR MANUFACTURING SEMICONDUCTOR DEVICE

(75) Inventor: Koichi Fukuda, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/875,683

(22) Filed: Jun. 25, 2004

(65) Prior Publication Data

US 2005/0130355 A1    Jun. 16, 2005

(30) Foreign Application Priority Data

Dec. 16, 2003    (JP)    ............... 2003-418282

(51) Int. Cl.
*H01L 21/8238*    (2006.01)

(52) U.S. Cl. ............... 438/231; 438/275; 438/283

(58) Field of Classification Search ............... 438/199, 438/207, 231, 232, 275, 276, 283, 289, 311, 438/301–302, 152, 149, 205
See application file for complete search history.

(56) References Cited

U.S. PATENT DOCUMENTS 5,675,172 A * 10/1997 Miyamoto et al. .......... 257/402
6,489,207 B2 * 12/2002 Furukawa et al. .......... 438/301
6,512,258 B2 *  1/2003 Maeda ...................... 257/303
6,828,634 B2 * 12/2004 Oshima ..................... 257/369

FOREIGN PATENT DOCUMENTS

JP    08-153880    6/1996

* cited by examiner

*Primary Examiner*—Hoai Pham
*Assistant Examiner*—Dilinh Nguyen
(74) *Attorney, Agent, or Firm*—Rabin & Berdo, PC

(57) ABSTRACT

Several a transistor, which are inhibited short channel effect moderately according to each transistor's channel length, are formed on a same SOI substrate.

In the present invention, forming a first transistor on SOI substrate, and forming a second transistor which has a gate electrode whose length is longer than a gate length of the first transistor in a channel direction The impurities are doped from above a surface of the SOI substrate in an oblique direction against the surface, and from source side and drain side of the first transistor and the second transistor.

By this means, a pocket layer is formed under an insulator layer of a SOI substrate.

13 Claims, 1 Drawing Sheet

METHOD FOR MANUFACTURING SEMICONDUCTOR DEVICE

BACKGROUND OF THE INVENTION

1. Field of the Invention

The present invention relates to a method for manufacturing a semiconductor device with transistors, each of which has several independent size of channel length, and each of which is inhibited short channel effect moderately.

This is counterpart of and claims priority to Japanese application Serial Number 418282/2003, filed on Dec. 16, 2003, the subject matter of which is incorporated herein by reference.

2. Description of the Related Art

It is known that transistor's threshold level of gate voltage changes when the transistor's channel length is shorted. The phenomenon is called "short channel effect". The short channel effect can, in part, be inhibited by making a doped layer, which is called "pocket layer", under a channel layer of the transistor.

By the way, a substrate, which is called silicon-on-insulator (SOI) substrate, is used for forming transistors on the substrate, in order to enhance the transistor speed and reduce the transistor's power consumption. An SOI substrate is a substrate in which a insulator layer is buried.

To inhibit short channel effect of the transistor formed on the SOI substrate, a pocket layer is formed in region deeper than the insulator layer under the transistor. The electric field, which occurs between the pocket layer and the gate electrode, decreases in a condition where the pocket layer is formed under the insulator layer, compared to a condition where the pocket layer is formed over the insulator layer. Therefore, carrier mobility increases, and transistor speed is enhanced.

Whether a bulk substrate is used or an SOI substrate is used to form a transistor, the more impurity density of the pocket layer increase, the more short channel effect of the transistor is inhibited effectively. But, electric field, which occurs between the pocket layer and the gate electrode, is enhanced. Therefore, carrier mobility decreases. On that account, the transistor speed decreases. To prevent transistor speed decreasing, the pocket layer is shrunk to be formed only the region near a source/drain of the transistor. However, if the pocket layer is too shrunk the inhibition of short channel effect is not enough.

Therefore, the size of the pocket layer must be controlled to strike a balance between inhibition of short channel effect and prevention of decrease of carrier mobility. To strike a balance between inhibition of short channel effect and prevention of decrease of carrier mobility, the size of the pocket layer is matched for the channel length of each transistor. Concretely speaking, the longer channel length of the transistor is, the more high density pocket layer is matched. Therefore, if forming transistors with several independent size, and forming pocket layers which have same size for each transistors, a part of the transistors have pocket layers with inappropriate size.

SUMMARY OF THE INVENTION

An object of the present invention is to provide a method for manufacturing semiconductor device that can form several transistors, which are inhibited short channel effect moderately according to each transistor's channel length, on a same SOI substrate.

According to one aspect of the present invention for achieving the above object, there is provided: forming a first transistor on substrate, which has a semiconductor layer on a insulator layer; forming a second transistor, which has a gate electrode whose length is longer than gate length of the first transistor in a channel direction on the substrate; doping impurities in an lower part of the insulator layer through the gate electrode; and the impurities are doped from above the surface in an oblique direction against the surface, and from source side and drain side of the first transistor and the second transistor.

DETAILED DESCRIPTION OF THE PREFERRED EMBODIMENT

Figure 1A:
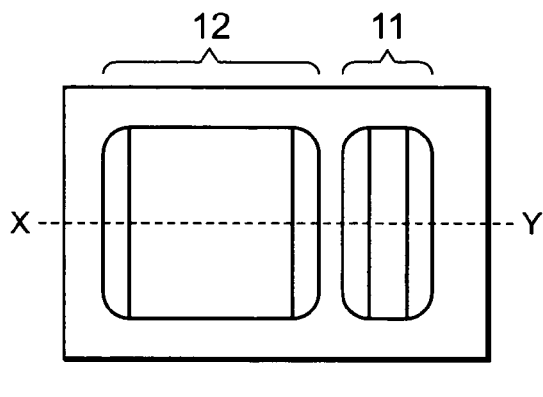
FIG. 1A is a top view of a semiconductor device according to a preferred embodiment of the present invention.
Figure 1B:
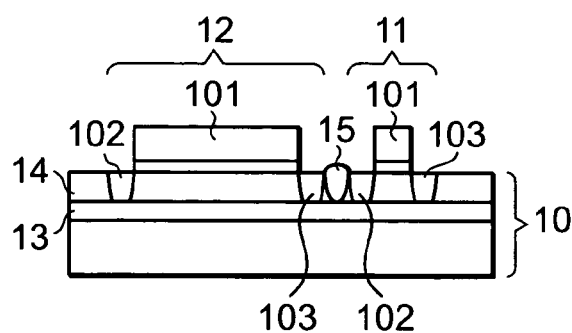
FIG. 1B is a sectional view of a semiconductor device according to a preferred embodiment of the present invention.
Figure 2A:
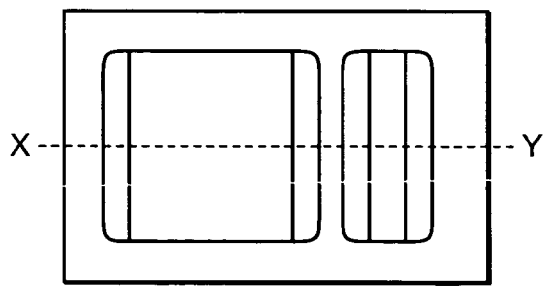
FIG. 2A is a top view of a semiconductor device according to a preferred embodiment of the present invention.
Figure 2B:
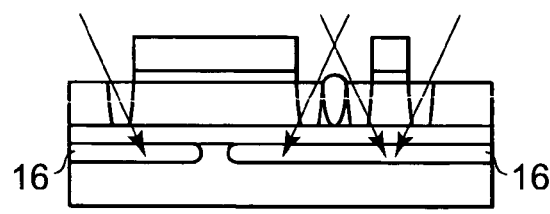
FIG. 2B is a sectional view of a semiconductor device according to a preferred embodiment of the present invention.

FIG. 1A is a top view of a semiconductor device according to a preferred embodiment of the present invention. FIG. 1B is a cross sectional view taken on dotted line X-Y of FIG. 1A. FIG. 2A is a top view of a semiconductor device according to a preferred embodiment of the present invention. FIG. 2B is a cross sectional view taken on dotted line X-Y of FIG. 2A The embodiment of the present invention will be explained with reference to FIGS. 1A–2B.

First, as shown in FIG. 1A and FIG. 1B, an isolation layer 15 is formed on a silicon-on-insulator (SOI) layer 14, formed on an insulator layer 13. And a first transistor 11 and a second transistor 12 are formed. Each transistor has a gate electrode 101, a source 102, and a drain 103. Here, impurity density of the SOI layer 14, the source 102, and the drain 103 are $10^{18}$ cm$^{-3}$, $10^{20}$ cm$^{-3}$, and $10^{20}$ cm$^{-3}$, respectively. And the source 102 and the drain 103 are formed so as to reach the insulator layer 13 from a surface of the SOI layer 14. The first transistor 11 and the second transistor 12 differ in channel length.

Here, the insulator layer 13 in the SOI substrate 10, has a thickness less than 50 nm and the SOI layer 14 has a thickness less than 50 nm, to inhibit short channel effect effectively by a pocket layer 16 formed under the insulator layer 13.

Next, as shown in FIG. 2A and FIG. 2B, impurities are doped a lower part of the insulator layer 13 through the gate electrode 101 of the first transistor 11 and the second transistor 12. Each electrode is used as a mask This doping is carried out from above SOI substrate 10 in an oblique direction against the surface of the SOI substrate 10, from the source 102 side and the drain 103 side of the each transistor. As a result, a pocket layer 16 is formed in the region doped the impurities. Impurity density of the pocket layer 16 is from $5\ddagger10^{17}$ cm$^{-3}$ to $10^{18}$ cm$^{-3}$. The impurities are same conductivity type as the SOI layer 14. And the impurities are doped, so as to reach a lower part of the source 102 from a lower part of the gate electrode 101, and so as to reach a lower part of the drain 103 from a lower part of the gate electrode 101.

Here, as shown in FIG. 1B, if channel length of the transistor is as short as channel length of the first transistor 11, the pocket layer 16, which has high density of impurities, is formed. Because, the impurities doped from the source 102 side and the impurities doped the drain 103 side overlap under the transistor. Therefore, short channel effect is inhibited strongly.

FIG. 2B shows that the doped pocket layer 16 has a gap under the second transistor 12: in other words, the impurities doped from above do not overlap under the gate of the second transistor 12 and are positioned away from each other. Conversely, as shown in FIG. 1B, if a channel length of the transistor is as short as channel length of the first transistor 11, the pocket layer 16, which has high density of impurities, is formed. Because, the impurities doped from the source 102 side and the impurities doped from the drain 103 side overlap under the transistor. Therefore, short channel effect is inhibited strongly.

And the semiconductor device, which is formed with above method, is adapted for a following semiconductor device. 1. The semiconductor device is adapted for a semiconductor device, which has a memory circuit and a logic circuit. The first transistor is adapted for a transistor in the memory circuit, and the second transistor is adapted for a transistor in the logic circuit. 2. The semiconductor device is adapted for a semiconductor device, which has a digital circuit and an analog circuit. The first transistor is adapted for a transistor in the digital circuit, and the second transistor is adapted for a transistor in the analog circuit. 3. The semiconductor device is adapted for a semiconductor device, which has a core circuit and a peripheral circuit. The first transistor is adapted for a transistor in the core circuit, and the second transistor is adapted for a transistor in the peripheral circuit.

As explained above, in the present invention, impurities are doped under insulator layer 13 through a gate electrode 11. Each electrode is used as a mask And this doping is carried out from above SOI substrate 10, in an oblique direction against the surface of the SOI substrate 10. Therefore, in a transistor has long channel, a pocket layer is shrunk for channel length On that account, short channel effect is inhibited moderately. On the other hand, in a transistor has short channel, a pocket layer is enlarged for channel length. On that account, short channel effect is inhibited strongly. Above all, in a transistor has very short channel, a pocket layer has high density of impurities is formed by overlapping impurities doped from a source side and impurities doped from a drain side under the gate electrode. On that account, short channel effect is inhibited especially strongly. Generically, the more gate length of a transistor is shrunk the more short channel effect is enhanced. Therefore, several a transistor, which is formed on a same substrate, is inhibited short channel effect moderately according to each transistor's channel length.

Additionally, by applying the present invention to following semiconductor device, the present invention displays following effectiveness.

1. The semiconductor device is adapted for a semiconductor device, which has a memory circuit and a logic circuit. The first transistor is adapted for a transistor in the memory circuit, and the second transistor is adapted for a transistor in the logic circuit. In this way, the memory circuit is highly integrated, because of being composed of small size transistors. On the other hand, the logic circuit is composed of large size transistors. Therefore, more current can be passed through the digital circuit. On that account, the digital circuit runs fast.

2. The semiconductor device is adapted for a semiconductor device, which has a digital circuit and an analog circuit. The first transistor is adapted for a transistor in the digital circuit, and the second transistor is adapted for a transistor in the analog circuit. In this way, the digital circuit is highly integrated, because of being composed of small size transistors. On the other hand, the analog circuit is composed of large size transistors. Therefore, the size of a transistor is adapted for the size in a design. On that account, the analog circuit runs exactly.

3. The semiconductor device is adapted for a semiconductor device, which has a core circuit and a peripheral circuit. The first transistor is adapted for a transistor in the core circuit, and the second transistor is adapted for a transistor in the peripheral circuit. In this way, the core circuit is highly integrated, because of being composed of small size transistors. On the other hand, the peripheral circuit is composed of large size transistors. Therefore, withstand voltage of the peripheral circuit is up. On that account, the peripheral circuit can be interfaced to external devices, which is adapted for high-voltage, easily.

In the present invention, impurities are doped under insulator layer through a gate electrode, as a mask of a transistor, from a source side and a drain side of the transistor, and at a rakish angle of a surface of a SOI substrate. Therefore, several a transistor, which is inhibited short channel effect moderately according to each transistor's channel length, can be formed on a same substrate.

What is claimed is:

1. A method for manufacturing a semiconductor device, said method comprising;
    providing a substrate which has a semiconductor layer and an insulating layer, wherein the insulating layer is laid on the substrate and the semiconductor layer is laid on the insulating layer;
    forming a first transistor at the semiconductor layer;
    forming a second transistor at the semiconductor layer, wherein the second transistor has a gate electrode whose length is longer than a gate length of the first transistor in a channel direction; and
    doping impurities into the substrate under the insulator layer, using the gate electrodes of the first and second transistors as masks;
    wherein the impurities are doped from above a surface of the semiconductor layer in an oblique direction against the surface, and from source side and drain side of the first transistor and the second transistor; and
    wherein the impurities are doped so that a region of the substrate into which the impurities are doped from the source side of the first transistor overlaps a region of the substrate into which the impurities are doped from the drain side of the first transistor.

2. The method as claimed in claim 1, wherein the first transistor is used for a memory circuit and the second transistor is used for a logic circuit.

3. The method as claimed in claim 1, wherein the first transistor is used for a digital circuit and the second transistor is used for an analog circuit.

4. The method as claimed in claim 1, wherein the first transistor is used for a core circuit and the second transistor is used for a peripheral circuit.

5. The method as claimed in claim 1, wherein the impurities doped from above do not overlap under the gate of the second transistor.

6. The method as claimed in claim 1, wherein the impurities are doped so that a region of the substrate into which the impurities from the source side of the second transistor are doped is positioned away from a region of the substrate into which the impurities from the drain side of the second transistor are doped.

7. A method for manufacturing semiconductor device, said method comprising;
provinding a substrate which has a semiconductor layer and an insulating layer, wherein the insulating layer is laid on the substrate and the semiconductor layer is laid on the insulating layer;
forming a first transistor on the semiconductor layer;
forming a second transistor on the semiconductor layer, wherein the second transistor has a gate electrode whose length is longer than a gate length of the first transistor in a channel direction;
doping impurities into the substrate under the insulator layer, using the gate electrodes of the first and second transistors as masks;
wherein the impurities are doped from source and drain sides of the first and second transistors, and so as to be right under the gate electrodes of the first and second transistors; and
wherein the impurities are doped so that a region of the substrate into which the impurities are doped from the source side of the first transistor overlaps a region of the substrate into which the impurities are doped from the drain side of the first transistor.

8. The method as claimed in claim 7, wherein the impurities are doped into one region of the substrate from both the source side and the drain side of the first transistor.

9. The method as claimed in claim 6, wherein the first transistor is used for a memory circuit and the second transistor is used for a logic circuit.

10. The method as claimed in claim 7, wherein the first transistor is used for a digital circuit and the second transistor is used for an analog circuit.

11. The method as claimed in claim 7, wherein the first transistor is used for a core circuit and the second transistor is used for a peripheral circuit.

12. The method as claimed in claim 7, wherein the impurities doped from above do not overlap under the gate of the second transistor.

13. The method as claimed in claim 7, wherein the impurities are doped so that a region of the substrate into which the impurities from the source side of the second transistor are doped is positioned away from a region of the substrate into which the impurities from the drain side of the second transistor are doped.

* * * * *